United States Patent
Ausserlechner et al.

(10) Patent No.: US 10,782,127 B2
(45) Date of Patent: Sep. 22, 2020

(54) MAGNETIC POSITION SENSORS, SYSTEMS AND METHODS

(71) Applicant: INFINEON TECHNOLOGIES AG, Neubiberg (DE)

(72) Inventors: Udo Ausserlechner, Villach (AT); Armin Satz, Villach (AT); Ferdinand Gastinger, Woelfnitz (AT)

(73) Assignee: Infineon Technologies AG, Neubiberg (DE)

( * ) Notice: Subject to any disclaimer, the term of this patent is extended or adjusted under 35 U.S.C. 154(b) by 664 days.

(21) Appl. No.: 14/251,861

(22) Filed: Apr. 14, 2014

(65) Prior Publication Data

US 2014/0218013 A1   Aug. 7, 2014

Related U.S. Application Data

(62) Division of application No. 13/213,338, filed on Aug. 19, 2011, now Pat. No. 8,717,010.

(51) Int. Cl.
*G01B 7/14*    (2006.01)
*G01B 13/02*   (2006.01)
(Continued)

(52) U.S. Cl.
CPC ............. *G01B 13/02* (2013.01); *G01D 5/145* (2013.01); *G01R 33/022* (2013.01); *G01R 33/077* (2013.01); *G01R 33/095* (2013.01)

(58) Field of Classification Search
CPC ...... G01D 5/145; G01D 5/147; G01R 33/022; G01R 33/06; G01R 33/02; G01B 7/30;
(Continued)

(56) References Cited

U.S. PATENT DOCUMENTS 4,612,502 A * 9/1986 Spies ...................... G01D 5/20
324/207.22
5,036,286 A * 7/1991 Holm-Kennedy ... G01R 33/038
324/259
(Continued)

FOREIGN PATENT DOCUMENTS

DE       19956361 A1     6/2000
DE       10314838 A1    10/2004
(Continued)

OTHER PUBLICATIONS

Ausserlechner et al., "A Theoretical Discussion of Vector Pick Up Systems for SQUID Magnetometers," *Institute of Applied and Technical Physics*, University of Vienna, Austria, pp. 989-1006, dated Jan. 5, 1998.
(Continued)

*Primary Examiner* — Thang X Le
(74) *Attorney, Agent, or Firm* — Schiff Hardin LLP (57) ABSTRACT

Magnetic position sensors, systems and methods are disclosed. In an embodiment, a position sensing system includes a magnetic field source; and a sensor module spaced apart from the magnetic field source, at least one of the magnetic field source or the sensor module configured to move relative to the other along a path, the sensor module configured to determine a position of the magnetic field source relative to the sensor module from a nonlinear function of a ratio of a first component of a magnetic field of the magnetic field source to a second component of the magnetic field of the magnetic field source.

18 Claims, 7 Drawing Sheets

(51) Int. Cl.
*G01R 33/022* (2006.01)
*G01D 5/14* (2006.01)
*G01R 33/07* (2006.01)
*G01R 33/09* (2006.01)

(58) Field of Classification Search
CPC .......... G01B 7/14; G01B 7/003; G01B 7/004; G01B 7/028; H01L 43/06; G01P 3/66
USPC .......... 324/252, 179, 207.2, 207.21, 207.22, 324/207.24, 259, 206, 174
See application file for complete search history.

(56) References Cited

U.S. PATENT DOCUMENTS

| | | | | |
|---|---|---|---|---|
| 5,428,334 | A * | 6/1995 | Leupold | H01F 7/0278 335/306 |
| 5,442,294 | A * | 8/1995 | Rorden | G01V 3/28 324/339 |
| 5,793,200 | A * | 8/1998 | Berrill | G01D 5/145 324/207.2 |
| 6,731,108 | B2 * | 5/2004 | Zalunardo | G01D 5/145 324/207.2 |
| 6,992,482 | B2 * | 1/2006 | Shay | G01N 27/902 324/232 |
| 7,038,458 | B1 | 5/2006 | Wiegert | |
| 7,173,507 | B2 | 2/2007 | Ries | |
| 7,932,718 | B1 * | 4/2011 | Wiegert | G01V 3/081 324/245 |
| 7,956,604 | B2 | 6/2011 | Ausserlechner | |
| 2004/0017187 | A1 * | 1/2004 | Van Ostrand | G01D 5/145 324/207.21 |
| 2005/0140363 | A1 | 6/2005 | Grimm | |
| 2005/0194966 | A1 * | 9/2005 | Martinez | G01D 5/145 324/207.2 |
| 2009/0001971 | A1 | 1/2009 | Racz | |
| 2009/0177436 | A1 | 7/2009 | Yoshida | |
| 2010/0277163 | A1 * | 11/2010 | Nakamura | G01D 5/145 324/228 |
| 2010/0295546 | A1 | 11/2010 | Walther | |
| 2010/0301840 | A1 | 12/2010 | Filatov | |
| 2011/0015895 | A1 | 1/2011 | Handa | |
| 2011/0227568 | A1 * | 9/2011 | Dordet | G01D 5/145 324/251 |
| 2012/0049849 | A1 | 3/2012 | Balcom | |
| 2012/0084051 | A1 * | 4/2012 | Hackner | G01V 3/081 702/153 |
| 2012/0098529 | A1 * | 4/2012 | Kurihara | G01D 5/145 324/207.25 |
| 2013/0027028 | A1 | 1/2013 | Hohe | |
| 2013/0245992 | A1 | 9/2013 | Servel | |

FOREIGN PATENT DOCUMENTS

| | | |
|---|---|---|
| DE | 102004060249 A1 | 7/2005 |
| EP | 2256521 * | 12/2010 |
| WO | WO 93/14370 | 4/1997 |
| WO | WO 2010/136164 | 12/2010 |

OTHER PUBLICATIONS

Melexis Microelectric Integrated Systems, MLX90333: Triaxis 3D-Joystick Position Sensor, pp. 1-38, dated May 2007.
Ausserlechner et al., "Pick-Up Systems for Vibratint Sample Magnetomers—a Theoretical Discussion Based on Magnetic Multipole Expansions," pp. 213-225, dated 1994.
Application and File History for U.S. Appl. No. 13/213,338, filed Aug. 19, 2011, Inventor: Ausserlechner.
Office Action dated Sep. 26, 2017 for German Patent Application No. 102012214648.2.

* cited by examiner

MAGNETIC POSITION SENSORS, SYSTEMS AND METHODS

RELATED APPLICATION

This application is a divisional of application Ser. No. 13/213,338 filed Aug. 19, 2011, which is hereby fully incorporated herein by reference.

TECHNICAL FIELD

The invention relates generally to sensors and more particularly to magnetic position sensors.

BACKGROUND

Magnetic sensors can be used for linear position sensing, i.e., sensing the position of a target in one dimension, as well as multi-dimensional positioning sensing. A permanent magnet is attached to the target, and the magnetic field of the magnet is measured by the magnetic sensor.

Conventional solutions for position sensing using magnetic sensors suffer from drawbacks, however. Some solutions do not have the capability to sense position in multiple dimensions. Others are not accurate and/or require mathematically complex calculations that are difficult to carry out with limited silicon area.

Therefore, there is a need for improved magnetic position sensors, sensing systems and methods.

SUMMARY

Magnetic position sensors, systems and methods are disclosed.

In an embodiment, a position sensing system comprises a magnetic field source; and a sensor module spaced apart from the magnetic field source, at least one of the magnetic field source or the sensor module configured to move relative to the other along a path, the sensor module configured to determine a position of the magnetic field source relative to the sensor module from a nonlinear function of a ratio of a first component of a magnetic field of the magnetic field source to a second component of the magnetic field of the magnetic field source.

In an embodiment, a method of sensing a linear position of an object comprises coupling one of a permanent magnet or a sensor to the object, the permanent magnet being magnetized in a z-direction; arranging the other of the sensor or the permanent magnet proximate to and spaced apart from the one of the permanent magnet or the sensor in a y-direction; sensing a change in an x-direction of a magnetic field component Bz of the permanent magnet by a first sensor element of the sensor; sensing a change in the y-direction of the magnetic field component Bz of the permanent magnet by a second sensor element of the sensor; determining a ratio of dBz/dx to dBz/dy; and determining a position of the object on the path from the ratio.

In an embodiment, a method of sensing a linear position of an object comprises coupling one of a permanent magnet or a sensor to the object, the permanent magnet being magnetized in a y-direction; arranging the other of the a sensor or the permanent magnet proximate to and spaced apart from the one of the permanent magnet or the sensor in a y-direction and a z-direction; sensing a Bx component of a magnetic field of the permanent magnet by a first sensor element of the sensor; sensing a Bz component of the magnetic field of the permanent magnet by a second sensor element of the sensor; determining a nonlinear function of Bx and Bz; and determining a position of the object on the path from the nonlinear function.

In an embodiment, a position sensing system comprises a dipole magnet homogenously magnetized in a z-direction and having a vanishing octupole moment; and a sensor module positioned proximate to but spaced apart from the dipole magnet and comprising a plurality of sensor elements to sense x, y and z components of a magnetic field of the dipole magnet, the sensor module configured to determine a relative position of the magnet to the sensor module from the x, y and z components of the magnetic field.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetic position sensors.

Figure 1:
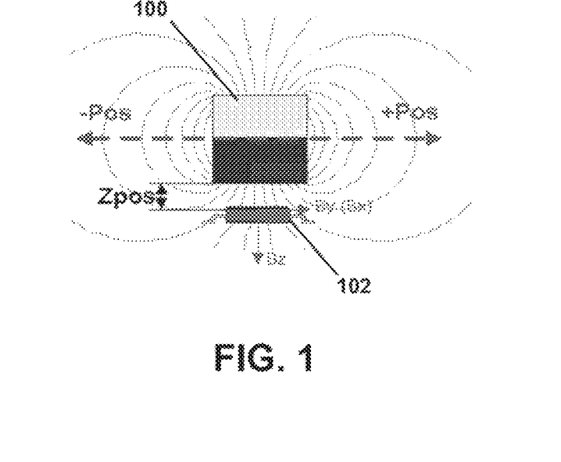
FIG. 1 is a block diagram of a magnet and sensor according to an embodiment.

FIG. 1 depicts a magnet 100 and a sensor system 102 configured to sense a position of the magnet. Magnet 100 is, most generally, a source of magnetic field and can comprise a permanent magnetic, electromagnet, coil winding or some other configuration in embodiments. As oriented in FIG. 1, the magnet is magnetized in the vertical (z) direction, and sensor system 102 senses a linear position of magnet 100 on the x-axis, but these orientations and axes can vary in other embodiments. The particular axes, coordinate systems and orientations used herein throughout are used for illustration and convenience only and are not fixed in space. Rather, x-, y- and z-axes are used to describe three perpendicular axes of an axis system that can be oriented in any space direction and can be stationary, moving and/or rotating relative to Earth's coordinate system.

Sensor system 102 detects the By and Bz components, where y is the coordinate along the magnet path and z is the vertical direction. Conventional systems estimate the y-position according to the following:

$$Xpos=m*\arctan(By/Bz)$$

These calculations are complex, and the system works only if sensor system 102 is directly below the path without any y-shift and at a well-defined vertical distance. Even then, the equation is only an approximation. Additionally, the results are linear only within a particular range of x. Thus, the results are not precise and are computationally complex to obtain.

Figure 2:
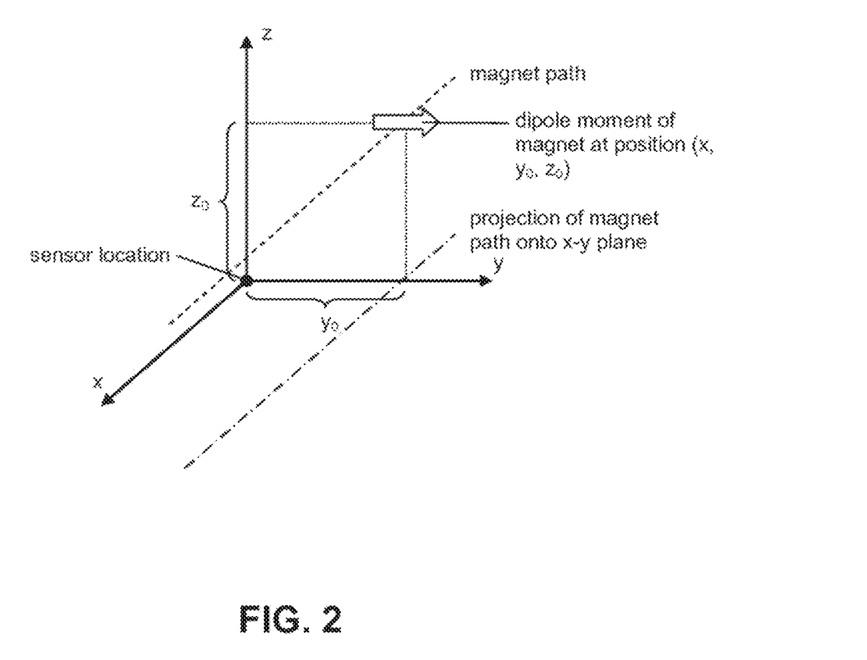
FIG. 2 is a diagram of a magnet path according to an embodiment.

Embodiments utilize similar magnet-sensor configurations but make certain assumptions that improve the accuracy and reduce the complexity of the system. Referring to FIG. 2, sensor system 102 is placed at (0,0,0), and magnet 100 moves along the illustrated magnet path and has a dipole moment in the y-direction in an embodiment. Sensor system 102 is therefore shifted in the y-direction by $y_0$ and in the z-direction by $z_0$ with respect to the magnet path. In other embodiments, magnet 100 is stationary at (0,0,0) and sensor system 102 moves along a path.

In an embodiment, sensor system 102 comprises a plurality of at least two sensor elements. A first sensor element detects the Bx-component and the second sensor element, the Bz-component. Sensor system 102 computes a ratio of Bx/Bz, which is proportional to the x-position of the dipole. If magnet 100 is a perfect dipole, then $x=z_0*(Bx/Bz)$.

If magnet 100 is not a perfect (spherical) dipole, $x=f(Bx/Bz)$, wherein f is a non-linear function that can be expressed by a polynomial of a second or higher order or by a look-up table in sensor system 102. In practice, spherical magnets can be used to obtain pure dipoles, but other magnet shapes can also be used, including cylinders, blocks and other suitable configurations. In embodiments, shapes that have small or vanishing octupole moments, which are good approximations of dipoles, can be chosen. For homogenous magnetization, the octupole moment vanishes for a specific aspect ratio of the magnet, e.g., length vs. diameter for cylindrical magnets. Higher magnetic multipoles are discussed in Ausserlechner et al., "Pick-Up Systems for Vibrating Sample Magnetometers: A Theoretical Discussion Based on Magnetic Multipole Expansions," Meas. Sci. Technol. 5, 213-225, 1994, which is incorporated herein by reference in its entirety.

In the aforementioned equations for x, it can be seen that the parameter $y_0$ is not a factor. Therefore, the system is robust against assembly tolerances in the y-direction. Moreover this means that the path does not necessarily have to be a straight-line parallel path to the x-axis, as depicted in FIG. 2; in embodiments, it can be an arbitrary curve in a plane $z=z_0$. In such embodiments, sensor 102 outputs the projection of the location onto the x-axis, i.e., the x-coordinate of the magnet location.

Additionally, embodiments can detect Bx and Bz individually and then compute a ratio. This, for example, can be a useful methodology in embodiments in which sensor 102 comprises a Hall effect device. Additionally, the system can also detect a cosine signal, proportional to $Bx/sqrt(Bx^2+Bz^2)$ and a sine signal proportional to $Bz/sqrt(Bx^2+Bz^2)$. The ratio of both can also be computed, as Bx/Bz. Sensor 102 can comprise other sensor elements that directly detect Bx/Bz and/or Bz/Bx in embodiments. In other words, in various embodiments it is desired to obtain some signal proportional to Bx/Bz, and whether such a signal comes from sensor 102 in some embodiments or results from on-chip signal processing in others is of little importance.

The system is also independent of the orientation of a substrate supporting sensor 102. It is possible to align a semiconductor die with its major surface parallel to the xy-plane. In this case, Bz is the out-of-plane component of the flux density, while Bx is one of the two in-plane components. In an embodiment, Bz can be detected with a conventional Hall plate and Bx with a vertical Hall effect device.

In embodiments, a top surface of the sensor substrate can be parallel to the xz-plane. In such an embodiment both Bx and Bz are in-plane components of the flux density. Both can then be detected with vertical Hall effect devices arranged perpendicular with respect to each other, or with magnetoresistive (xMR) strips. For example, in one embodiment anisotropic magnetoresistive (AMR) strips with perpendicular current flow directions are used, though giant MR (GMR) or other xMR technologies can be used in other embodiments.

Figure 3A:
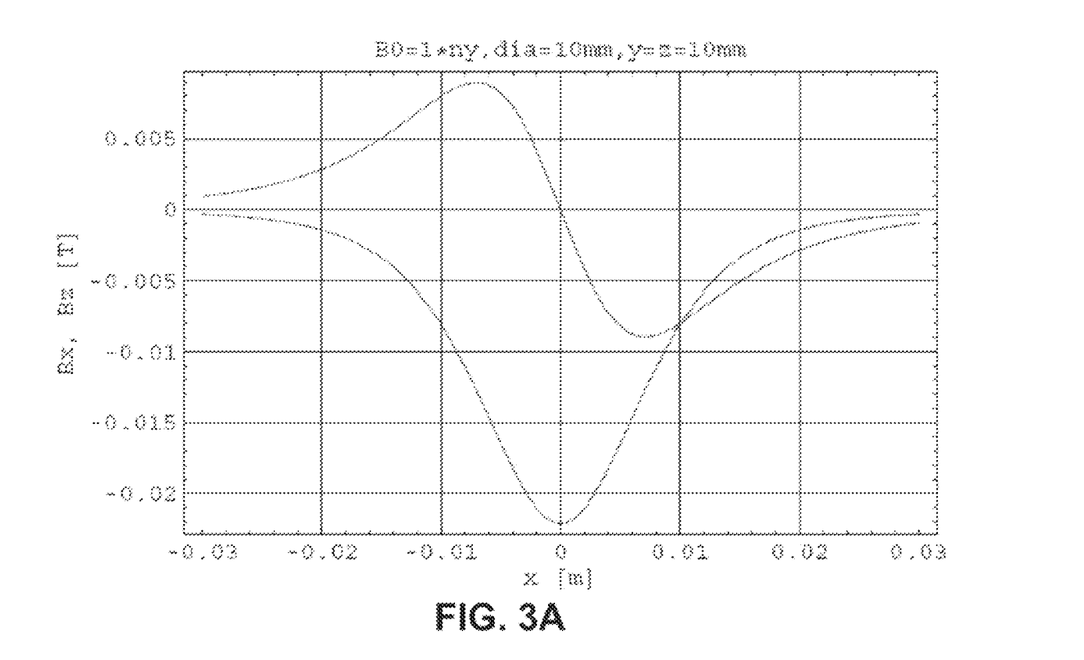
FIG. 3A is a graph of magnetic field components versus distance according to an embodiment.

Referring to FIG. 3A, simulation results for a spherical magnet having a 10 mm diameter and 1 T remanence, magnetized in the y-direction, are shown. The magnet moves along a path parallel to the x-axis with $y_0=10$ mm and $z_0=10$ mm (refer also to FIG. 2). Flux densities Bx and Bz are depicted in FIG. 3A.

Figure 3B:
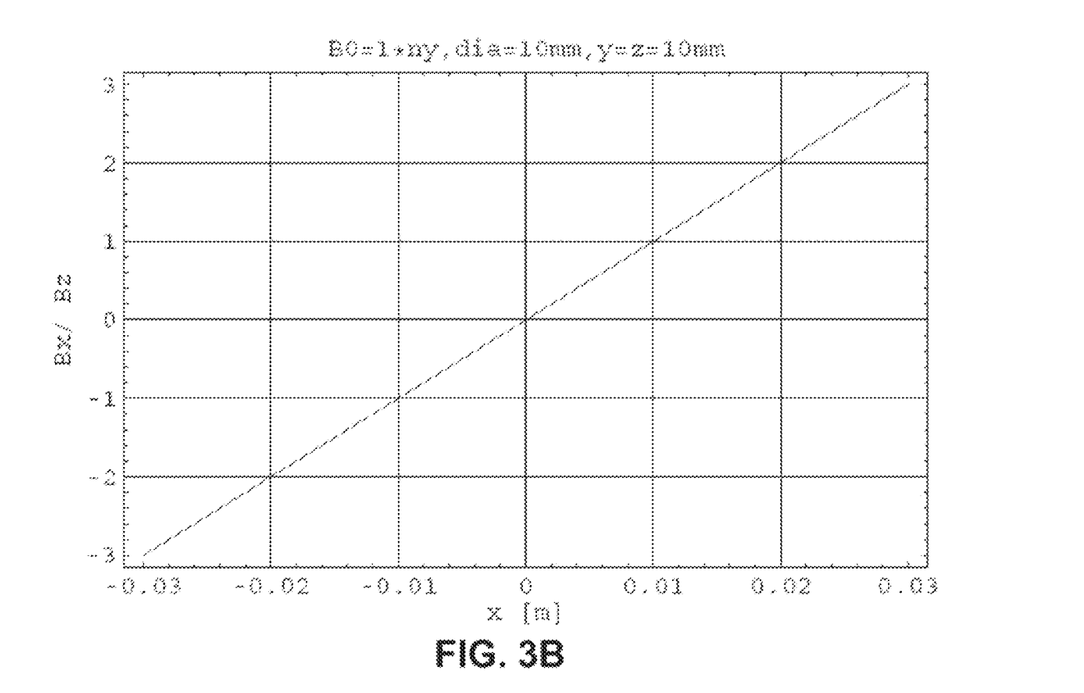
FIG. 3B is a graph of a ratio of magnetic field components versus distance according to an embodiment.

As can be seen, flux densities Bx and Bz without about +/−20 mm of the center are larger than 1 mT, which is easily detectable by various magnetic field sensors like xMRs and/or Hall effect devices. The ratio of the fields, depicted in FIG. 3B, is linear.

Figure 3C:
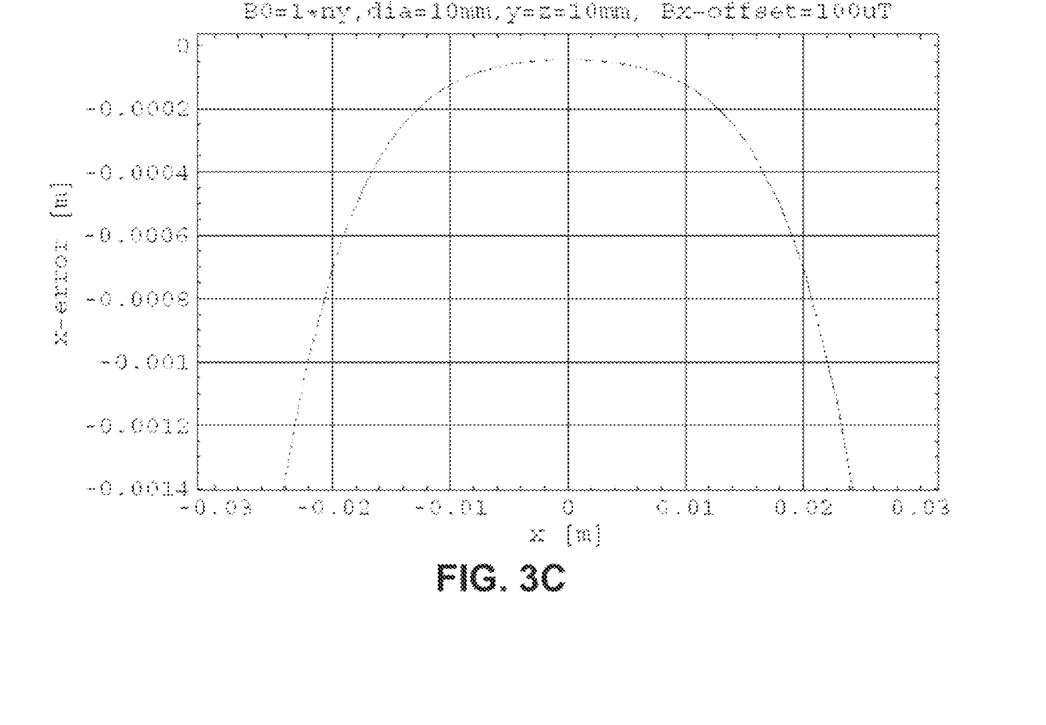
FIG. 3C is a graph of distance error versus distance according to an embodiment.

Assuming a zero-point error of the Bx sensor of Bx-offset=100 µT, the error in the position estimation is then as depicted in FIG. 3C. At about x=+/−13 mm, the error in the x-estimation is −0.2 mm. at about x=+−/20 mm, the error is about −0.7 mm. If the x-position is kept fixed, e.g., at the large value of about +/−20 mm, and the zero-point error of the Bx sensor is changed, the error in the estimation of the x-position is linear with respect to the zero-point error.

Figure 4A:
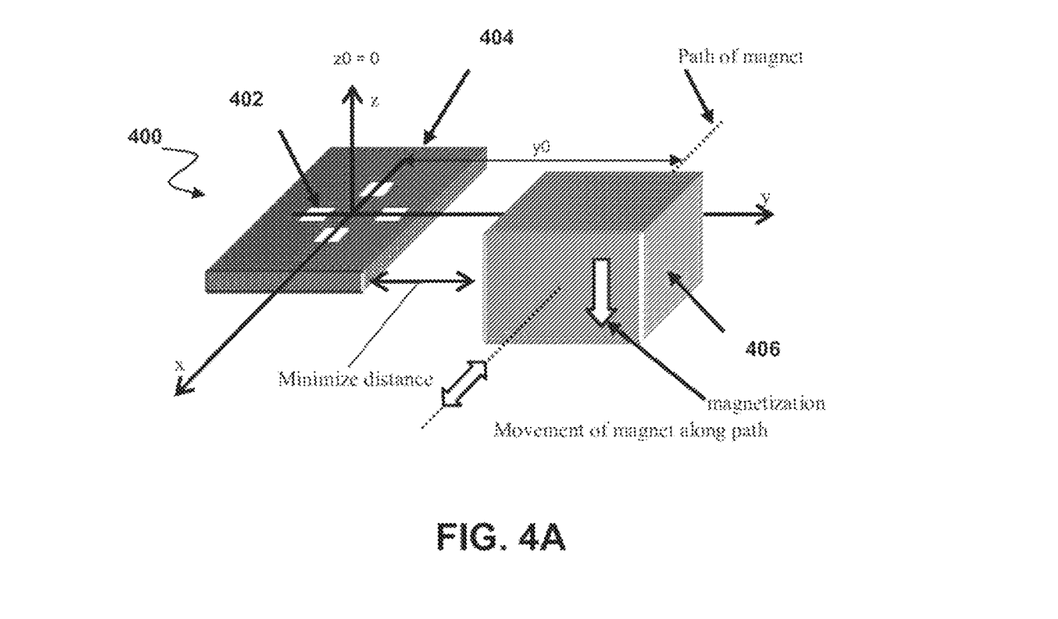
FIG. 4A is a diagram of a sensor system according to an embodiment.

In other embodiments, lateral Hall plates alone can be used to implement a gradiometric system that is robust against homogeneous background magnetic fields. Referring to FIG. 4A, a sensor system 400 comprises at least two sensor elements 402, such as Hall plates. Sensor elements 402 are arranged on a substrate or semiconductor die 404. At least one sensor element detects the gradient dBz/dx associated with a magnetic field of a magnet 406 and at least one other sensor element detects the gradient dBz/dy. Sensor system 400 determines a ratio of (dBz/dx)/(dBz/dy), which is proportional to the x-position of magnet 406. Sensor system 400 can detect the gradients individually and determine their ratio, or system 400 can detect Bz(x+del_x/2) and Bz(x−del_x/2) and estimate dBz/dx≈(Bz(x+del_x/2)−Bz(x−del_x/2)/del_x, analogously for the y-direction. If magnet 406 is a perfect dipole, as discussed above, then $x=y_0*(dBz/dx)/(dBz/dy)$.

As in other embodiments, perfect (i.e., spherical) magnets can be used, or other shapes can be used in other embodiments. If magnet 406 is a perfect dipole in the z-direction, then the gradients are as follows:

$$\frac{\partial B_z}{\partial x} = \frac{-3B_{rem}V}{4\pi} \times \frac{x^2 + y_0^2 - 4z_0^2}{(x^2 + y^2 + z_0^2)^2}$$

and $$\frac{\partial B_z}{\partial y} = \frac{-3B_{rem}V}{4\pi} y_0 \frac{x^2 + y_0^2 - 4z_0^2}{(x^2 + y^2 + z_0^2)^{7/2}}.$$

It follows that:

$$\frac{\partial B_z}{\partial x} \bigg/ \frac{\partial B_z}{\partial y} = \frac{x}{y_0}.$$

In practice, sensor system can be challenged when magnet 406 passes the point:

$$2|z_0| = \sqrt{x^2 + y_0^2}$$

Because both gradients vanish and a division-by-zero occurs in the following equation:

$$x = y_0 \frac{\partial B_z}{\partial x} \bigg/ \frac{\partial B_z}{\partial y}.$$

In embodiments, therefore, 2*abs(z0)<abs(y0) is designed for, and $z_0=0$ is chosen. Additionally, $y_0$, the distance between the x-axis and the path of magnet 406, is as small as possible in embodiments in order to have strong field gradients, the limits of which are given by the requirement that magnet 406 not collide with the sensor package of sensor system 400.

Also similar to as previously discussed, even if magnet 406 is not a perfect dipole, then x=f((dBz/dx)/(dBz/dy)), where f is a nonlinear function that can be expressed by a polynomial of the second or higher order or by a look-up table.

Similar to other embodiments discussed, the parameter $z_0$ does not enter the aforementioned equation for x. Thus, these embodiments are also robust with respect to assembly tolerances, here in the z-direction. Additionally, the path need not be a straight line parallel to the x-axis, and the path could be an arbitrary curve in a $y=y_0$ plane.

As in other embodiments, system 400 is independent of substrate 404 orientation. In FIG. 4A, a major surface of substrate 404 on which sensor elements 402 are mounted is parallel with the xy-plane. Bz is the out-of-plane component of the flux density and can be detected with conventional lateral Hall plates. The gradient of Bz along the x-axis is detected by two Hall plates placed along the x-axis, and the signals of these plates are then subtracted. The gradient of Bz along the y-axis is detected by two Hall plates placed along the y-axis, with their signals subtracted. It can be advantageous in such embodiments for the die or substrate 404 to be packaged in a sensor package having sensor leads positioned on a single side of the package that opposes magnet 406.

Figure 4B:
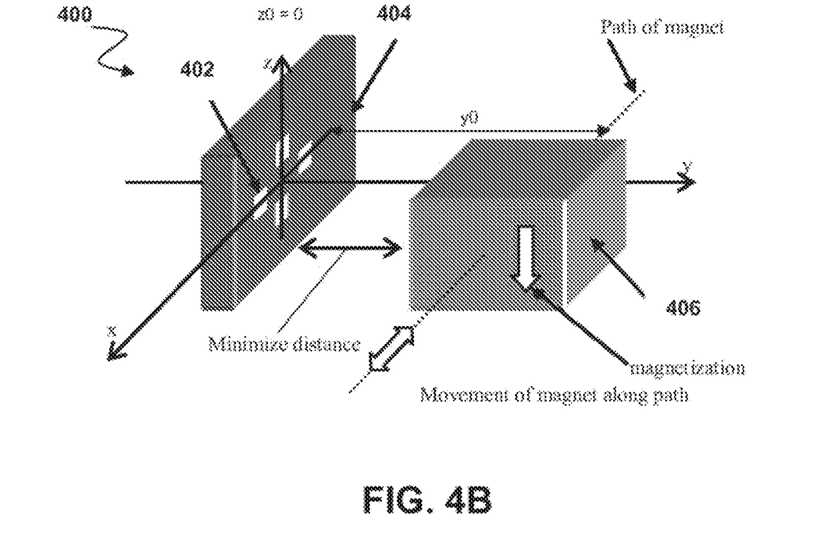
FIG. 4B is a diagram of a sensor system according to an embodiment.

In the embodiment of FIG. 4B, substrate 404 is oriented with the major surface on which sensor elements 402 are mounted being parallel to the xz-plane. In this embodiment, Bz is an in-plane component of the flux density and can be detected with vertical Hall elements or with magnetoresistive (xMR) strips, such as AMR, GMR or some other technology, as sensor elements 402. As depicted in FIG. 4B, sensor elements 402 are located at the same y-coordinate, and it is possible to derive the y-gradient from Maxwell's equation:

$$\frac{\partial B_z}{\partial y} = -\frac{\partial B_x}{\partial x} - \frac{\partial B_z}{\partial z}$$

with $$\frac{\partial B_z}{\partial z} \approx \frac{B_z(0, 0, \Delta/2) - B_z(0, 0, -\Delta/2)}{\Delta}$$

and $$\frac{\partial B_z}{\partial x} \approx \frac{B_z(\Delta/2, 0, 0) - B_z(-\Delta/2, 0, 0)}{\Delta}$$

Figure 5A:
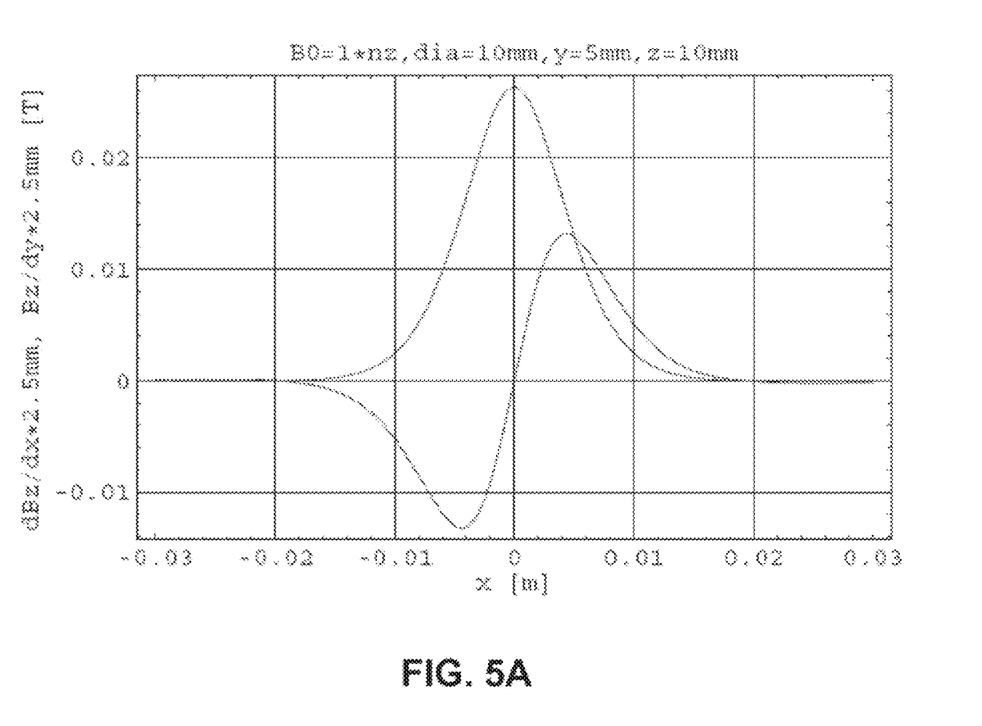
FIG. 5A is a graph of magnetic field gradients versus distance according to an embodiment.

Referring to FIG. 5A, simulation results for a spherical magnet having a 10 mm diameter and 1 T remanence, magnetized in the z-direction, are shown. The magnet moves along a path parallel to the x-axis with $y_0=5$ mm and $z_0=10$ mm (refer also to FIGS. 2 and 4B). Gradients dBz/dx and dBz/dy are depicted in FIG. 5A.

As can be seen, both curves have zero-crossings at x=+/−about 0.02 m. The system in this embodiment can be operated in the region |x|<about 15 mm, wherein the ratio of gradients is a linear function of the x-position, avoiding the zero-crossings.

Figure 5B:
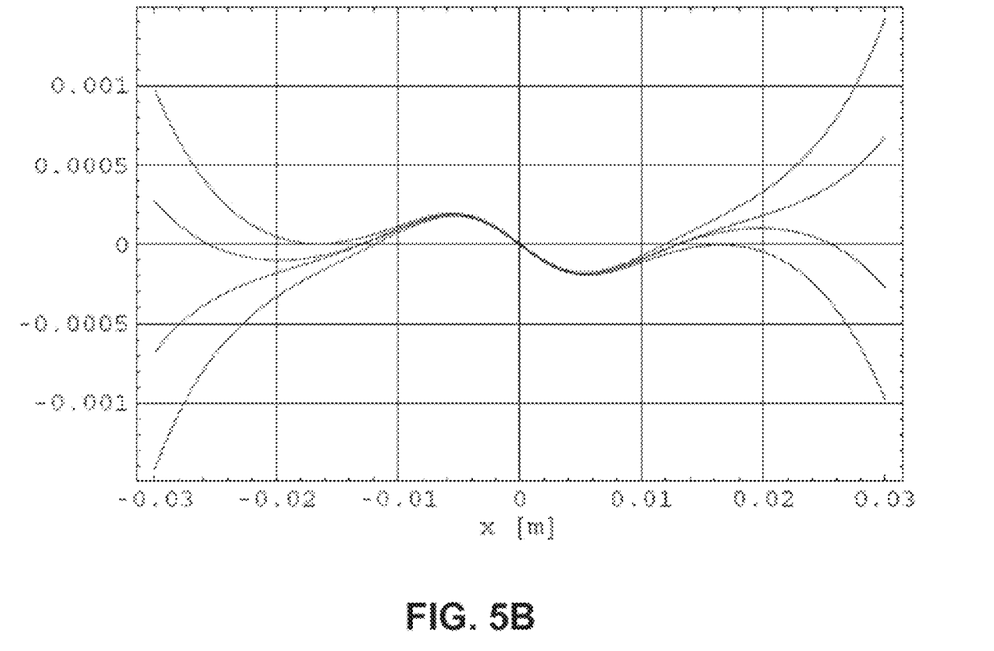
FIG. 5B is a graph of distance error versus distance according to an embodiment.

Referring to FIG. 5B, simulation results for a spherical magnet with a 20 mm diameter and 1 T remanence are depicted. The path of the magnet is in the x-direction with y0=13 mm and z0=0. The sensor elements are positioned at (x,y,z)=(1.3 mm, 0, 0), (−1.3 mm, 0, 0), (0, 1.3 mm, 0) and (0, −1.3 mm, 0), and the gradient in the x-direction is approximated by the subtraction of two opposing sensor elements. The difference between both sensor elements in the x- or y-direction is assumed to have a zero-point error of +/−25 µT, which leads to the errors in the estimation of the x-position as depicted in FIG. 5B.

For |x|<15 mm, the error is less than +/−0.2 mm and is mainly due to the fact that the gradient is approximated by the difference; as this is a systematic error, it can be improved by a nonlinear function that operates on the ratio of the gradients. At large |x|, different curves occur depending on the exact offset error of the sensor elements. These errors in the estimation of x can be reduced in embodiments by using stronger magnets, such as magnets with larger dipole moments and having larger remanence and/or volume, or by reducing the zero-point error of the sensor elements. A stroke of |x|<20 mm has errors within a band of +/−0.35 mm, and a stroke of 30 mm has errors within a band of +/−1.5 mm.

Embodiments can be made more accurate for small |x| by adding one or more additional sensor elements 402 with smaller spacing on substrate 404. For example, the aforementioned embodiment had two Hall plates arranged on the x-axis with a spacing of about 2.6 mm and two Hall plates arranged on the y-axis with a spacing of about 2.6 mm. Because of the relatively large spacing, the difference of two Hall plate signals does not approximate the gradient very precisely and can have an error of about +/−0.2 mm at x=+/−5 mm. An additional Hall plate on each of the x-axis and the y-axis with a spacing of about 0.6 mm provides that their differences can be used to obtain a better approximation of the gradients.

It is also possible in embodiments to use only two additional sensor elements on the x-axis with about 0.6 mm of spacing and use the sensors with 2.6 mm spacing on the y-axis to approximate the ratio of gradients as follows:

$$\frac{\partial B_z}{\partial x} \bigg/ \frac{\partial B_z}{\partial y} \approx \frac{B_z(0.3 \text{ mm}, 0, 0) - B_z(-0.3 \text{ mm}, 0, 0)}{0.6 \text{ mm}} \times$$

$$\frac{2.6 \text{ mm}}{B_z(0, 1.3 \text{ mm}, 0) - B_z(0, -1.3 \text{ mm})}$$

Embodiments can also be made suitable for extended measurement ranges. This can be done, for example, by detecting the minima and maxima of the Bz field. In one embodiment, and referring to the sensor system 600 of FIG. 6A, vertical Hall elements 602 and 604 are used as switches for either Bx (602) or By (604). Sensor elements 602 and 604 sense the minima and maxima in the out-of-plane component Bz sensed by lateral Hall element 606. Use of vertical Hall elements 602 and 604 as switches can extend the range of lateral Hall element 606, and elements 602 and 604 can be optimized for a very small measurement range because only the switching limit is covered by vertical Hall elements 602 and 604. Lateral Hall element 606, sensing the out-of-plane Bz component, can be designed for a much larger measurement range in embodiments.

Figure 6A:
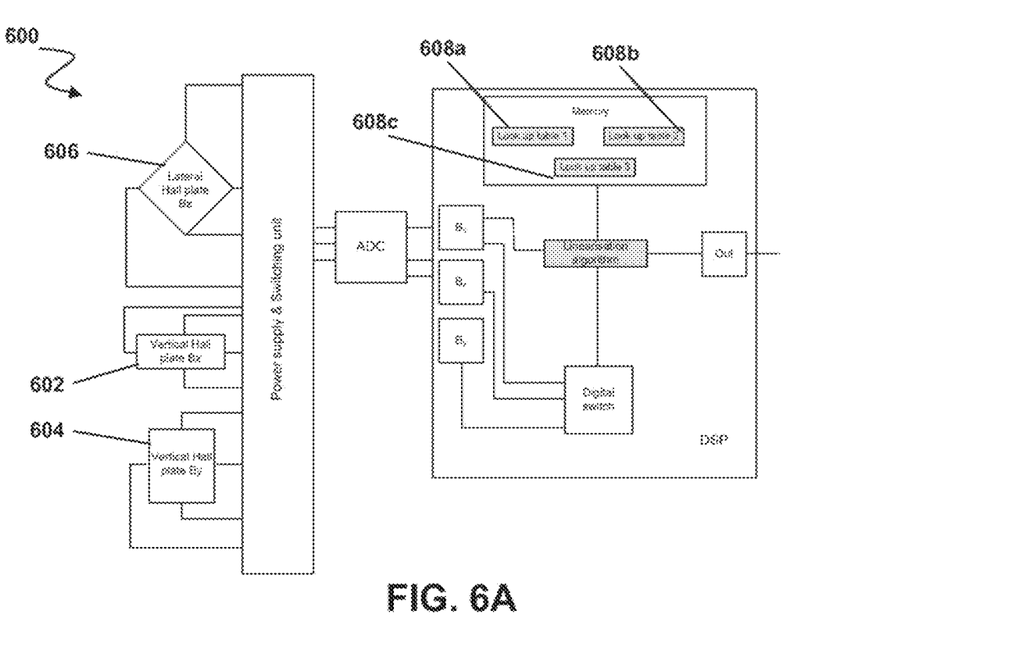
FIG. 6A is a block diagram of a sensor system according to an embodiment.

By determining the minima and maxima of Bz, with reference to the embodiment of FIG. 6A, sensor system 600 can determine which linear range the signal is within in order to determine which of three look-up tables 608 to use for a linearization algorithm. A first look-up table 608a is associated with a sensor range less than the minima of Bz, a second 608b with a range between the minima and maxima and a third 608c with a range above the maxima.

Figure 6B:
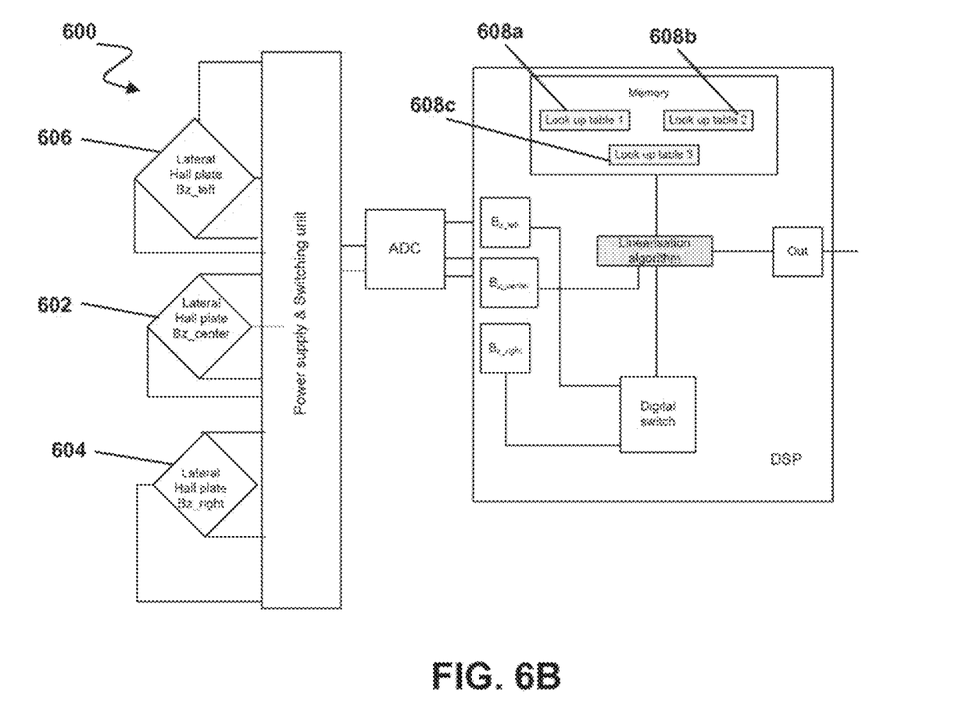
FIG. 6B is a block diagram of a sensor system according to an embodiment.

In another embodiment, and referring to FIG. 6B, a differential arrangement can be used to calculate the gradient of Bz. The gradient can be used for the detection of the local minima and serves a switch between three different linearization tables 608a-c. All of sensor elements 602, 604 and 606 can be lateral Hall elements in such an embodiment.

Embodiments also relate to detecting the position of an element that moves in three-dimensional space. These embodiments rely on the theory that location estimation works better with increased distance; in other words, the position sensor favors far-field approximation of the field over near-field contributions. The far-field is the dipole part of the field, whereas the near-field includes higher multipole parts. This suggests that an ideal magnet is a pure dipole with vertical magnetization.

As previously mentioned, the simplest way to obtain a dipole is by a using a spherically-shaped magnet. If a perfect dipole magnet is used, the magnetic field is:

$Bx=Brem*\text{Volume}/(4*Pi*r^5)*3*x*z$ $By=Brem*\text{Volume}/(4*Pi*r^5)*3*y*z$ $Bz=Brem*\text{Volume}/(4*pi*r^5)*(2*z^2-x^2-y^2)$ where r=sqrt(x^2+y^2+z^2), which is a nonlinear function of x, y and z; x=y=z=0 in the center of the magnet, Brem is the remanence of the magnet, and Volume is the volume of the magnet. Thus, there are three equations for three unknowns (x,y,z) if Brem*Volume is assumed to be known. The positions can be obtained by solving the set of equations, which can be done in myriad ways.

The system can thus determine not just a single coordinate but all three x, y and z coordinates. Moreover, the system is not plagued by inaccuracies close to the magnet, as in conventional solutions, because the magnetic field has no higher order multi-pole contributions. The field has only a dipole no matter how large the distance between the magnet and sensor.

Movement of the magnet can be in x- or y-direction or within planes parallel to the xy-plane. Movement can include z-contributions, thus the direction of magnetization does not need to be perpendicular to the movement, as in conventional solutions.

The sensor for three-dimensional embodiments is desired to be highly linear over a wide dynamic range. Therefore, xMR elements and magnetic concentrators are generally not suitable. Hall devices, however, can be used, with lateral Hall elements measuring the magnetic field component perpendicular to the die surface and vertical hall devices measuring the in-plane field components. It is also possible in embodiments to use lateral Hall plates in combination with soft magnetic components, such as spheres.

In practice, the magnetic field decreases when the moving magnet is farther away from the sensor, i.e., at maximum stroke of the movement. The system can therefore be vulnerable to interference from external magnetic fields, such as electromagnetic interference (EMI), the earth's field or other electromechanical equipment, and shielding can be implemented in embodiments.

Figure 7A:
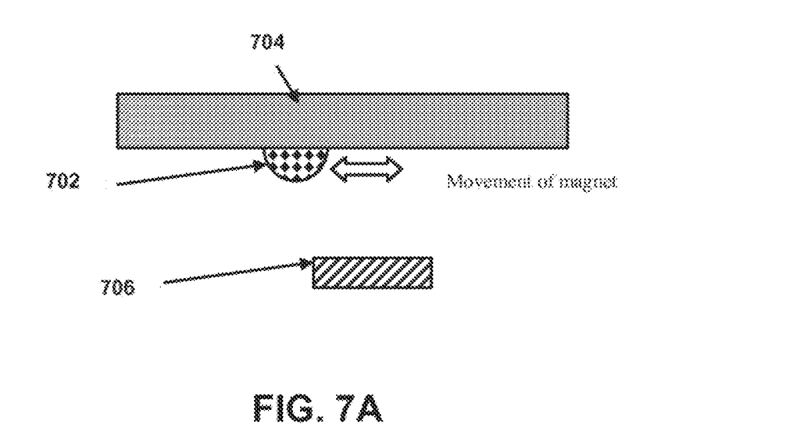
FIG. 7A is a diagram of a sensor system according to an embodiment.

Referring to FIG. 7A, a hemispherical magnet 702 is mounted on a surface of a panel 704 spaced apart from a sensor 706. In embodiments, panel 704 can comprise a soft magnetic material, such as iron, steel or some other suitable material and is highly permeable, e.g., μr>>1. As such, panel 704 acts as a magnetic mirror, mirroring the half-sphere magnet 702 to form a complete sphere. Thus, the relatively more expensive material of magnet 702 is saved while maintaining the same strength of the magnetic field on sensor 706, and panel 704 shields magnet 702 and sensor 706 from external magnetic disturbances.

In embodiments, panel 704 and magnet 702 are firmly coupled such that panel 704 moves with the body having a position to be detected. In other embodiments, panel 704 can be stationary, with magnet 702 moving relative to panel 704. A small gap exists between panel 704 and magnet 702 in these embodiments to enable magnet 702 to move.

Figure 7B:
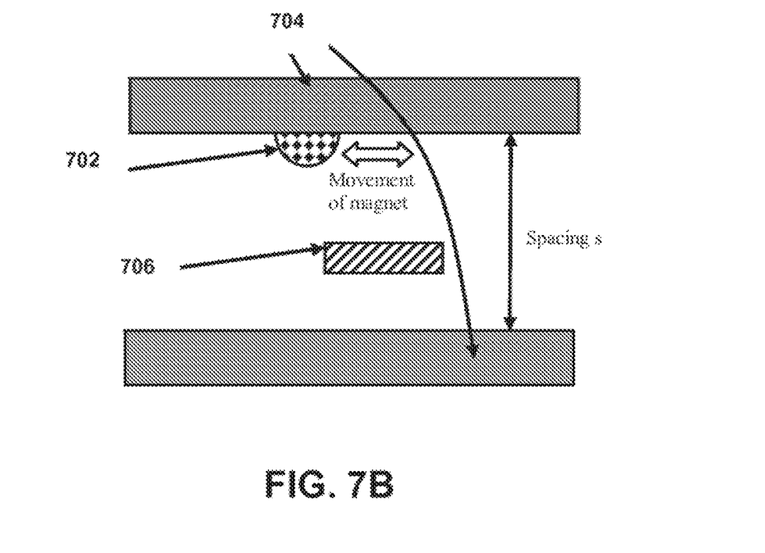
FIG. 7B is a diagram of a sensor system according to an embodiment.
Figure 7C:
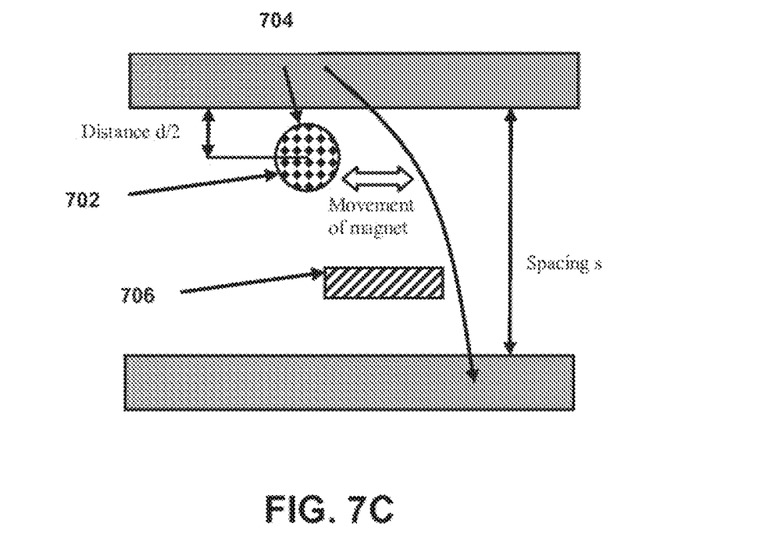
FIG. 7C is a diagram of a sensor system according to an embodiment.

While panel 704 is depicted as a flat or rectangular structure, it can have other shapes in various embodiments, such as arced, a hollow cylinder or any curves surface, among others. It can be advantageous in embodiments for the distance between magnet 702 and panel 704 to remain constant during movement of magnet 702. Embodiments can also comprise multiple panels 704, as depicted in FIGS. 7B and 7C, which create infinite numbers of dipoles given the mirroring effects of the opposing panels 704.

The shape and configuration of magnet 702 can also vary. In general, magnet 702 has negligible higher multipoles; in other words, magnet 702 can be shaped to make the octupole vanish, which can be accomplished in embodiments by forming a hole or recess in a cylindrical magnet.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A position sensing system comprising:
   a non-spherical magnet with a dipole moment in a y-direction and lacking an octupole moment in the y-direction; and
   a sensor positioned proximate to but spaced apart from the magnet and comprising a plurality of sensor elements to sense x, y and z components of a magnetic field of the magnet, the sensor configured to determine a relative position of the magnet to the sensor from the x, y and z components of the magnetic field.

2. The system of claim 1, further comprising a magnetic shielding element arranged relative to the non-spherical magnet to create a dipole magnetic field.

3. The system of claim 2, wherein the magnetic shielding element has a relative permeability greater than 1.

4. The system of claim 2, wherein the non-spherical magnet is coupled to the magnetic shielding element.

5. The system of claim 2, wherein the non-spherical magnet is spaced apart from the magnetic shielding element.

6. The system of claim 1, wherein the non-spherical magnet is homogenously magnetized, and the vanishing octupole moment vanishes for a specific aspect ratio of the magnet.

7. The system of claim 6, wherein the non-spherical magnet is cylindrically-shaped.

8. The system of claim 1, wherein the non-spherical magnet is cylindrically-shaped and comprises a hole or a recess.

9. The system of claim 1, further comprising:
   a magnetic shielding element,
   wherein the non-spherical magnet is half-sphere-shaped, and a flat side of the half-sphere-shaped magnet is parallel with and substantially near a flat surface of the magnetic shielding element.

10. The system of claim 9, wherein the magnetic shielding element has a plate-like shape.

11. The system of claim 9, wherein the half-sphere-shaped magnet is fixed in location with respect to the magnetic shielding element.

12. The system of claim 9, wherein the half-sphere-shaped magnet is movable with respect to the magnetic shielding element.

13. The system of claim 12, wherein the magnetic shielding element has an elongated shape in a moveable direction of the half-sphere-shaped magnet.

14. The system of claim 13, wherein the half-sphere-shaped magnet is spaced apart from the magnetic shielding element by a constant distance.

15. The system of claim 9, further comprising:
   two parallel magnetic shielding elements,
   wherein the non-spherical magnet is located between the two magnetic shielding elements.

16. The system of claim 15, wherein the sensor is located between the two parallel magnetic shielding elements.

17. The system of claim 15, wherein each of the two magnetic shielding elements has a plate-like shape.

18. A position sensing system, comprising:
   a dipole magnet having a dipole moment in a y-direction, lacking an octupole moment in the y-direction, and having a vanishing octupole moment;
   a sensor positioned proximate to but spaced apart from the dipole magnet and comprising a plurality of sensor elements to sense x, y and z components of a magnetic field of the magnet, the sensor configured to determine a relative position of the magnet to the sensor from the x, y and z components of the magnetic field; and
   two parallel magnetic shielding elements,
   wherein each of the dipole magnet and the sensor module is located and movable between the two parallel magnetic shielding elements.

* * * * *